(12) United States Patent
Wi

(10) Patent No.: US 8,409,400 B2
(45) Date of Patent: Apr. 2, 2013

(54) INDUCTIVE PLASMA CHAMBER HAVING MULTI DISCHARGE TUBE BRIDGE

(75) Inventor: Soon-Im Wi, Suwon-si (KR)

(73) Assignee: Gen Co., Ltd., Suwon-si (KR)

( * ) Notice: Subject to any disclaimer, the term of this patent is extended or adjusted under 35 U.S.C. 154(b) by 626 days.

(21) Appl. No.: 10/833,312

(22) Filed: Apr. 28, 2004

(65) Prior Publication Data

US 2005/0000655 A1    Jan. 6, 2005

(30) Foreign Application Priority Data

May 7, 2003   (KR) .......................... 10-2003-0028846
Oct. 14, 2003 (KR) .......................... 10-2003-0071435

(51) Int. Cl.
C23F 1/00 (2006.01)
H01L 21/306 (2006.01)
C23C 16/00 (2006.01)
H01J 7/24 (2006.01)

(52) U.S. Cl. ............ 156/345.48; 118/723 I; 315/111.51

(58) Field of Classification Search .................. 118/715, 118/722, 723 R, 723 I, 723 IR; 156/345.48, 156/345.49, 345.35, 345.38; 315/111.21, 315/111.41, 111.51
See application file for complete search history.

(56) References Cited

U.S. PATENT DOCUMENTS

| | | | |
|---|---|---|---|
| 4,431,898 A |  | 2/1984 | Reinberg et al. |
| 6,348,126 B1 | * | 2/2002 | Hanawa et al. ............ 156/345.49 |
| 6,392,351 B1 |  | 5/2002 | Shun'ko |
| 6,418,874 B1 | * | 7/2002 | Cox et al. ...................... 118/723 I |
| 6,432,260 B1 |  | 8/2002 | Mahoney et al. |
| 6,486,431 B1 | * | 11/2002 | Smith et al. ............... 219/121.57 |
| 6,755,150 B2 | * | 6/2004 | Lai et al. ...................... 118/723 I |

* cited by examiner

*Primary Examiner* — Maureen Gramaglia
(74) *Attorney, Agent, or Firm* — NSIP Law

(57) ABSTRACT

An inductive plasma chamber of the present invention comprises a plurality of discharge tube bridges connected between a discharge tube head and a process chamber. The discharge tube head is disc shaped and a cylindrical gas inlet which a gas is injected is disposed in its center. A susceptor on which a workpiece is placed is disposed inside a process chamber and a flange of upper certain area has an inclined surface which is upward centrally inclined. The discharge tube bridge is provided with at least one ferrite core, and the ferrite core has a winding connected to a power supply source. When a process gas is injected via the gas inlet and a RF power from the power supply source is supplied with a winding, the electromotive force is transmitted inside the discharge tube head, the discharge bridge and the process chamber so that the plasma discharge is occurred in the plasma chamber. The plasma chamber comprises a switching means enabling plasma discharge paths to be alternately formed between the plurality of discharge tube bridges. The switching means switches in a predetermined period to be alternately formed the plasma discharge paths between the plurality of discharge tube bridges. The inductive plasma chamber can obtain high-density plasma while enhancing uniformity as well as enlarging plasma volume.

12 Claims, 16 Drawing Sheets

INDUCTIVE PLASMA CHAMBER HAVING MULTI DISCHARGE TUBE BRIDGE

BACKGROUND OF THE INVENTION

1. Field of the Invention

The present invention relates to a plasma source, and more particularly, to an inductive coupled plasma source and an inductive plasma chamber comprising a plurality of discharge tube bridges.

2. Description of the Prior Art

Plasma is a highly ionized gas containing an identical number of positive ions and electrons. At the present time, plasma sources have a variety of applications in several fields. The plasma sources are being used for example for cleaning, etching, deposition, and the like in manufacturing semiconductor devices for producing semiconductor chips.

Generating technologies of inductive coupled plasma (ICP) or transformer coupled plasma (TCP) have been extensively studied in this application field. The RF ICP technology has the advantage that there is no electrode to be in contact with the plasma in providing electro-magnetic energy for generating the plasma. A capacitive coupled plasma (CCP) method using an electrode has a bad influence upon a final product because impurities are generated from the electrode in contact with plasma.

The generating technologies of the inductive coupled plasma (ICP) or the transformer coupled plasma (TCP) have extensively studied in this application field. Capacitive Coupled Plasma (CCP) method using the electrode has a bad influence upon the final product because impurities are generated from the electrode in contact with the plasma. However, a RF ICP method has an advantage of not having electrodes in contact with the plasma in providing electro-magnetic energy for plasma generation. As a technology related to an early ICP technology, a technology related to an inductively coupled discharge for plasma etching and resist stripping is disclosed in U.S. Pat. No. 4,431,898 issued Feb. 14, 1984 to Alan R. Reinberg et al.

Recently, a plasma source with larger volume, uniformity and high density is required as a workpiece becomes larger in the technical field using the plasma. In a case of a semiconductor device field, a plasma source capable of effectively processing a large-sized wafer is required, and a plasma source enabling the liquid crystal display panel having a large size to be processed is also required in production of the liquid crystal display panel. However, the ICP technology is difficult to obtain high-density plasma having high uniformity only by simply enlarging the size of an inductive coil or a transformer to obtain the plasma having a large volume.

As a related technology, an inductive RF plasma source with an external discharge bridge is disclosed in U.S. Pat. No. 6,392,351 issued on May 21, 2002 to Evgeny V. Shun'ko. An inductively coupled ring-plasma source apparatus for processing gases and materials and a method thereof is disclosed in U.S. Pat. No. 6,432,260 issued on Aug. 13, 2002 to Leonard J. Mahoney.

However, it is difficult to obtain high-density plasma with improved uniformity along with a large volume only with a C-shaped bridge to which a transformer proposed in the above-stated technologies is coupled. For example, a connection structure between the C-shaped bridge and a working chamber or a process chamber is a structure in which it is difficult for plasma gas to uniformly diffuse while maintaining a high density in the working chamber. Further, if the plasma source comprises a plurality of C-shaped bridges as in these technologies, a gas supply structure for supplying process gases is inevitably designed in a complex structure.

SUMMARY OF THE INVENTION

The present invention is conceived to solve the aforementioned problems, and it is an object of the present invention to provide an inductive plasma chamber having multiple discharge bridges capable of uniformly obtaining high density plasma while increasing the volume of plasma.

According to the present invention for achieving the object, there is provided an inductive plasma chamber comprising multiple discharge tube bridges, comprising: a hollow discharge tube head having a gas inlet which a gas is injected and a plurality of openings; a process chamber provided with a gas outlet for exhausting the gas and a susceptor on which a workpiece is placed inside the process chamber, wherein a plurality of opening corresponding to the openings of the discharge tube head are formed in upper surface of the chamber; a plurality of hollow discharge tube bridge connected between the openings of the discharge tube head and the openings of the process chamber, and at least one ferrite core disposed in each of the discharge tube bridge, wherein the ferrite core comprises a winding connected to a power supply source to generate electromotive force for plasma generation in the discharge tube head, the discharge bridge and the process chamber.

According to another feature of the present invention, there is provided an inductive plasma chamber comprising multiple discharge tube bridges, comprising; a process chamber having an inclined surface of which central portion is raised and centrally upwardly inclined, and provided with a gas outlet for exhausting a gas and a susceptor on which a workpiece is placed inside it; a gas introducing tube which is disposed at the upper center of the process chamber and to which the gas is injected; a plurality of hollow discharge bridge connected between a plurality of openings formed around the process chamber and a plurality of openings formed around the gas input tube; and at least one ferrite core disposed in each of the discharge tube bridge, wherein the ferrite core comprises a winding connected to a power supply source to generate electromotive force for plasma generation in the discharge tube bridge and the process chamber.

According to yet another feature of the present invention, there is provided an inductive plasma chamber comprising multiple discharge tube bridges, comprising: a hollow discharge tube head having a gas inlet which a gas is injected and a plurality of openings; a chamber housing having a gas outlet for exhausting the gas and a susceptor on which a workpiece is placed inside the chamber housing, where a plurality of opening corresponding to the openings of the discharge tube head are formed on a upper surface of the chamber housing; a plurality of hollow bridges connected between the openings of the discharge tube head and the opening of the process chamber; at least one ferrite core disposed in each of the discharge tube bridge and an induction coil wound on the ferrite core to be connected the power supply source; and a discharge path switching means for allowing the plasma discharge path to be alternately formed between the plurality of discharge tube bridges.

BRIEF DESCRIPTIONS OF THE DRAWINGS

The above and other features and advantages of the present invention will become more apparent to those of ordinary skill in the art by describing in detail preferred embodiments thereof with reference to the accompanying drawings in which.

DETAILED DESCRIPTION OF THE PREFERRED EMBODIMENT

Hereinafter, preferred embodiments of the present invention will be described in detail with reference to the accompanying drawings. However, the present invention is not limited to the embodiments described herein and can be embodied in various forms. The embodiments disclosed herein are provided in order that the disclosure become firm and complete and the spirit of the present invention is sufficiently delivered to those skilled in the art.

Figure 1:
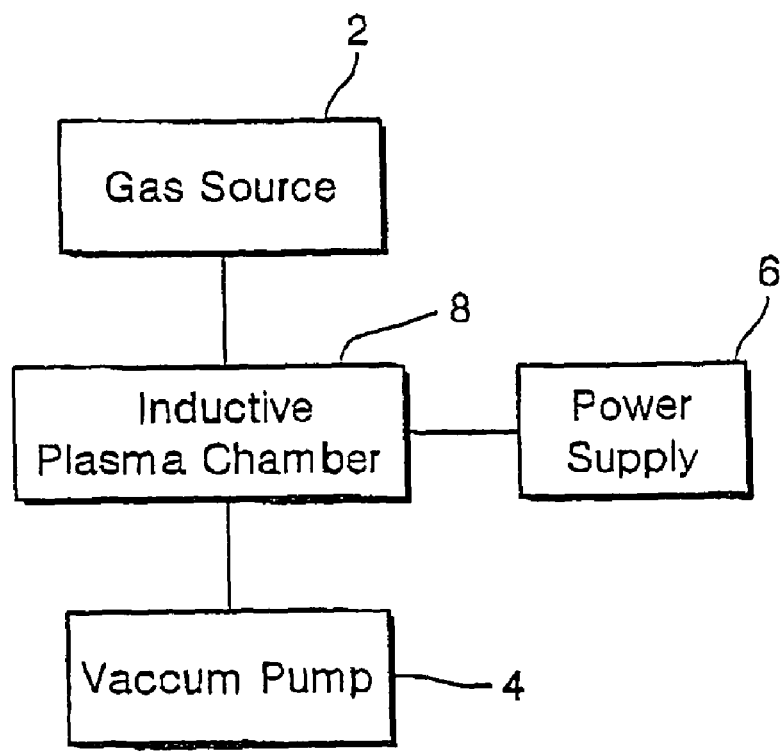
FIG. 1 is a schematic view showing a construction of a plasma process system using an inductive plasma chamber according to the present invention.

FIG. 1 is a schematic view showing a construction of a plasma process system using an inductive plasma chamber of the present invention. An inductive plasma chamber 8 of the present invention is connected to introduce discharge gases from a gas source 2, and is connected to vacuum pump 4 to maintain a certain vacuum state. The chamber is supplied with a power supply from the power supply source 6 to generate plasma.

Figure 2:
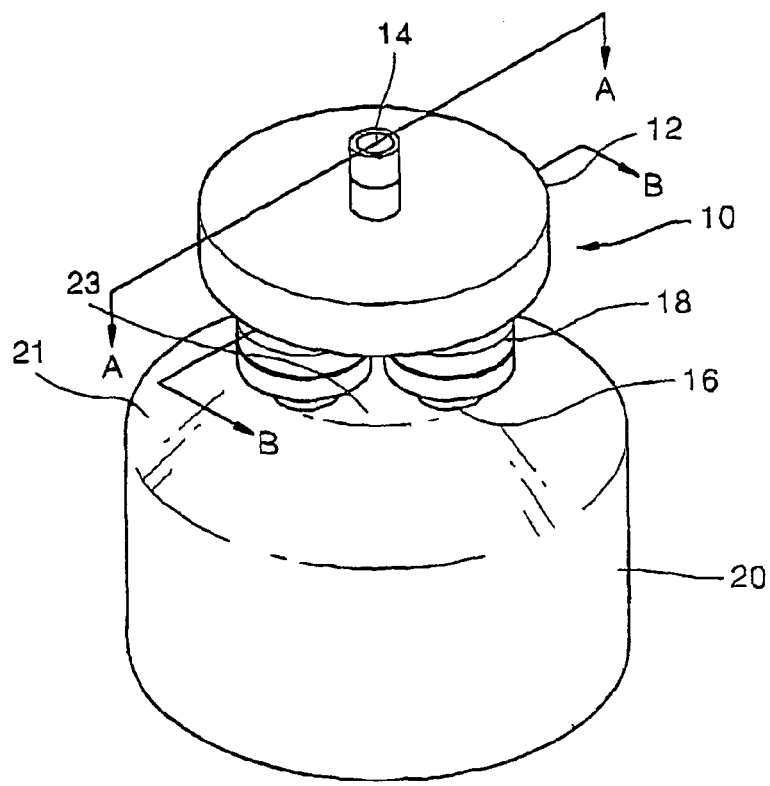
FIG. 2 is a perspective view of an inductive plasma chamber according to an embodiment of the present invention.
Figure 3:
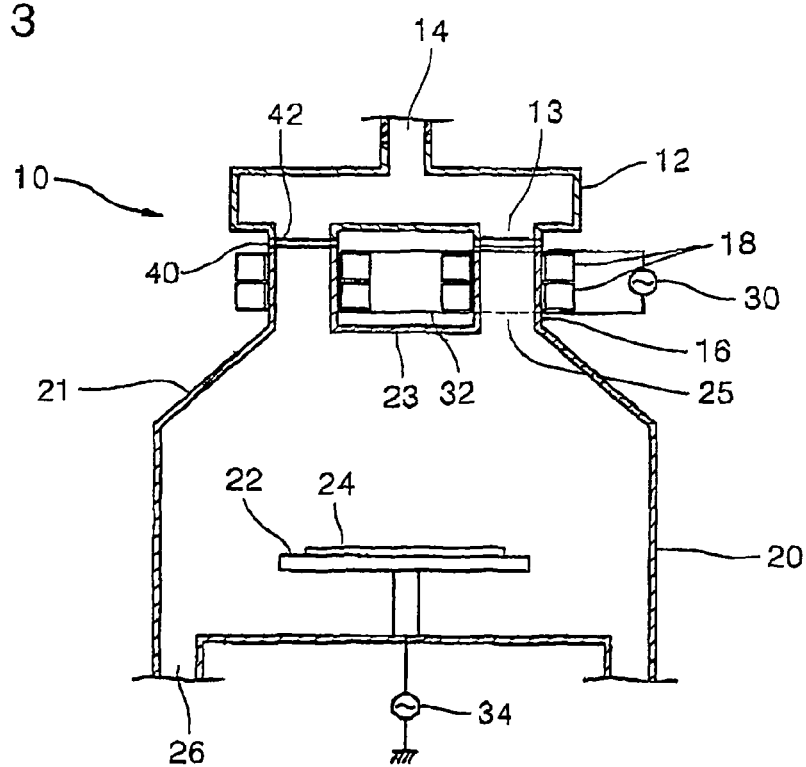
FIG. 3 is a sectional view taken along a line A-A of the inductive plasma chamber in FIG. 2.

FIG. 2 is a perspective view of an inductive plasma chamber according to an embodiment of the present invention, and FIG. 3 is a sectional view taken along a line A-A of the inductive plasma chamber in FIG. 2.

Referring to the figure, the inductive plasma chamber is roughly composed of a process chamber 20 and a plasma reactor 10 on the process chamber. The plasma reactor 10 consists of a hollow discharge tube head 12 and a plurality of hollow discharge bridges 16. The discharge tube head 12 and the discharge bridges 16 may use aluminum coated with alumina.

The discharge tube head 12 has a hollow disc-shape and is provided with a cylindrical gas inlet 14 in which gases are injected at the center of its upper portion. Process gases are provided through the gas inlet 14 from a gas supply source. The gas inlet 14 may be insulated by insulating material of separate ceramic material. A plurality of openings 13 are formed in lower portion of the discharge tube head 12.

A process chamber 20 is provided with a gas outlet coupled with a vacuum pump for exhausting a gas into a bottom and a susceptor 22 on which a workpiece, namely, wafer is placed. The susceptor 22 is electrically connected to a bias power supply source 34. A plurality of openings 25 corresponding to the openings 13 of the discharge tube head 12 are formed in its upper surface 23. In particular, the process chamber 20 has an inclined surface 21 in which a flange In the upper certain area is upwardly inclined toward its center.

Figure 4:
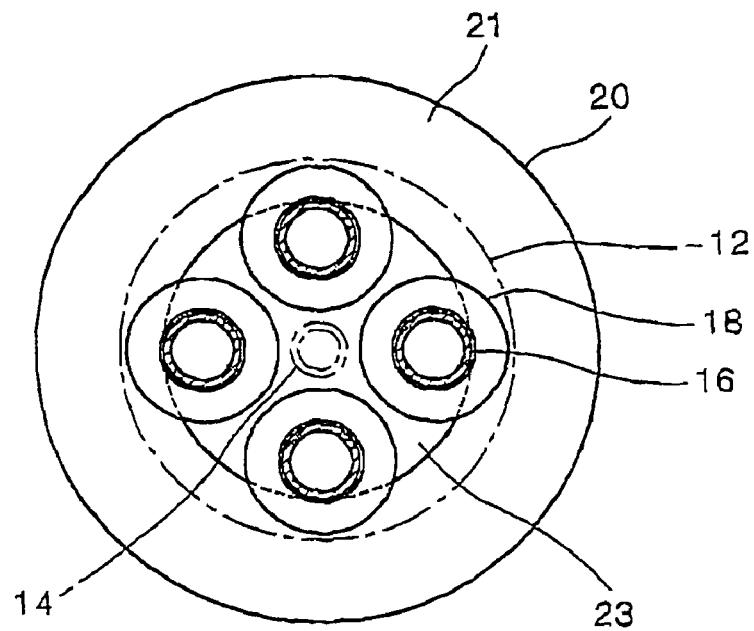
FIG. 4 is a sectional view taken along a line B-B of the inductive plasma chamber in FIG. 2, which is a view showing an example in which four discharge tube bridges are disposed.
Figure 5:
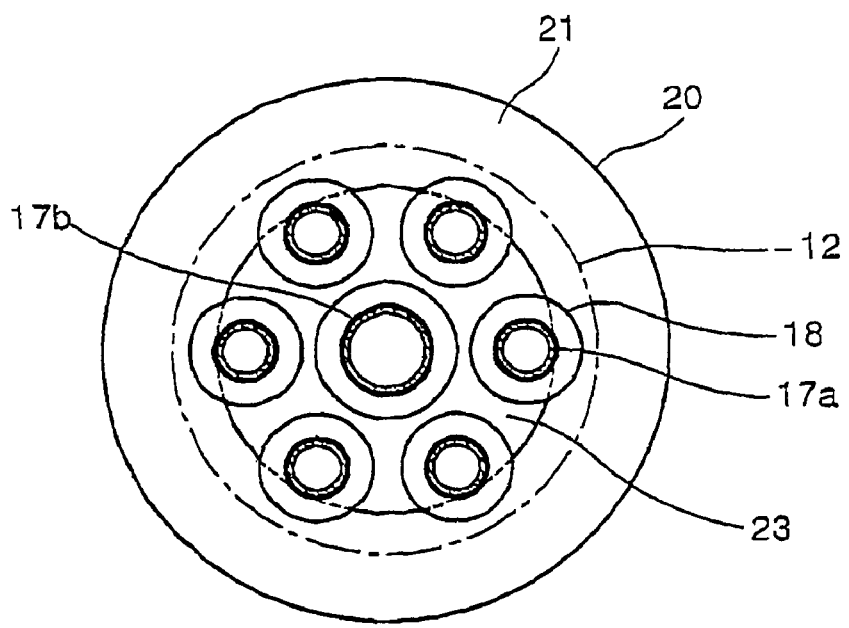
FIG. 5 is a top view showing an example in which seven discharge tube bridges are disposed.

The discharge tube bridges 16 are connected between the openings 13 of the discharge tube head 12 and the openings 25 of the process chamber 20, respectively. The discharge bridge 16 is cylindrical, and the plurality of discharge tube bridges 16 are all arranged in the upper surface of the process chamber 20 in a symmetric structure at fixed intervals. For example, as shown in FIG. 4, four discharge tube bridges 16 may be arranged. Alternatively, as shown in FIG. 5, six discharge tube bridges 17b are arranged in the upper surface 23 in a circle and one discharge bridge 17b is positioned in the their center. In this case, it is preferred that a transverse section area of the central discharge tube bridge 17b become an about half of sum of transverse section area of other discharge tube bridges 17a positioned around the bridge 17b.

Figure 6:
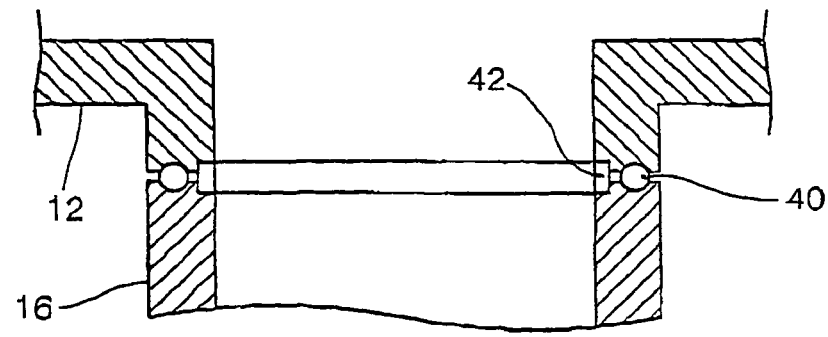
FIG. 6 is a view showing an insulating structure of a discharge tube head and multiple discharge tubes.

Each of the discharge tube bridges 16 is provided with at least one ferrite core 18, and the ferrite core 18 has a winding 32 connected to the power supply source 30. As shown in FIG. 6, a ring-shaped vacuum seal 40 is displaced between the discharge tube head 12 and the discharge tube bridge 16, and a ring-shaped insulation member 42, for example a ceramic ring is disposed therein.

Such an inductive plasma chamber of the present invention transmits an electromotive force into the discharge tube head 12, the discharge tube bridge 16 and the process chamber 20 to cause plasma discharge when the process gases are injected through the gas inlet 14 and RF power from the power supply source 30 is supplied with the winding 32. Discharge paths are made between the discharge tube bridges which are opposite to each other when four discharge tube bridges 16 are present. When seven discharge tube bridges 17a and 17b are present, discharge paths are formed commonly in the center discharge tube bridge 17b.

Thus, multiple discharge paths are formed by the multiple discharge tube bridges 16 so that a high density plasma with a large volume is formed in the process chamber 20. Then, the generated plasma gases uniformly diffuse toward the lower portion of the process chamber 20 above which the susceptor 22 is positioned since the flange of the upper certain area of the process chamber 20 has the inclined surface 21 which is upwardly and centrally inclined.

Figure 7:
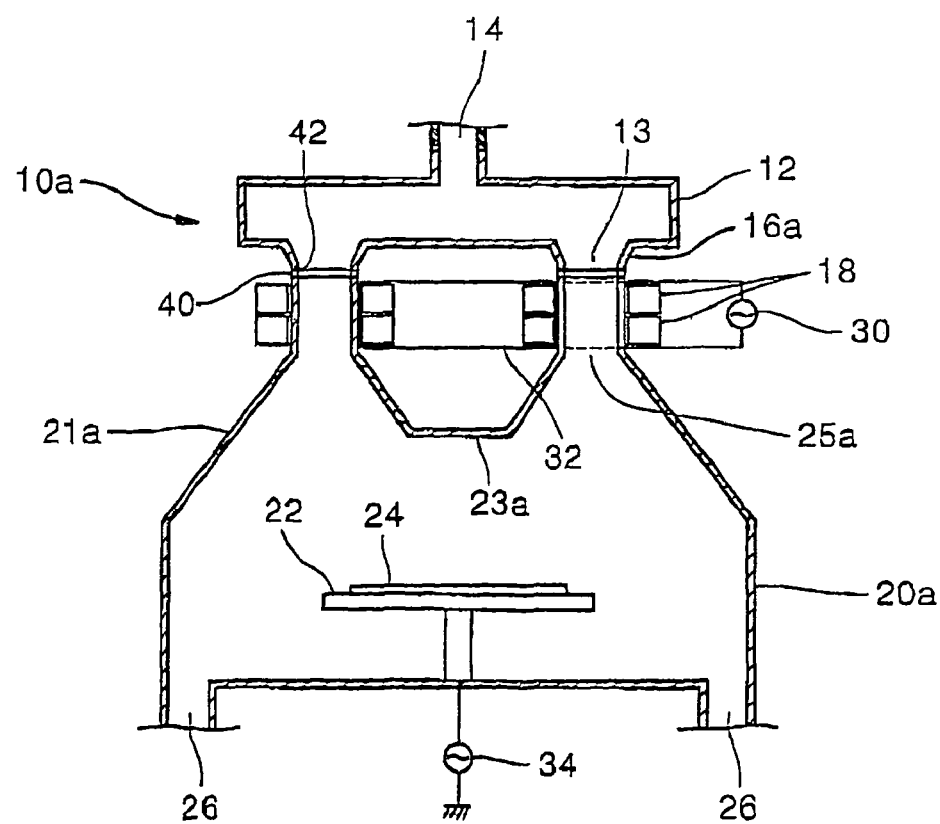
FIG. 7 is a sectional view of a modified example of a structure of a discharge tube bridge and a process chamber.

To further improve efficiency, the inductive plasma chamber may be modified as shown in FIG. 6. FIG. 7 is a sectional view showing a modified example of a structure of discharge tube bridge and process chamber.

Referring to the figure, the discharge tube bridge 16a enables the inflow of gas to be easier by enabling the discharge tube bridge to have the extending structure in which diameter of the upper end portion connected the opening of the discharge tube head 12 become large gradually. Together with this or separately from this, it is possible to enable top surface 23a of the process chamber 20 to have a centrally inclined structure. It can exhaust more easily the gas and can assist the uniform diffusion.

Figure 8:
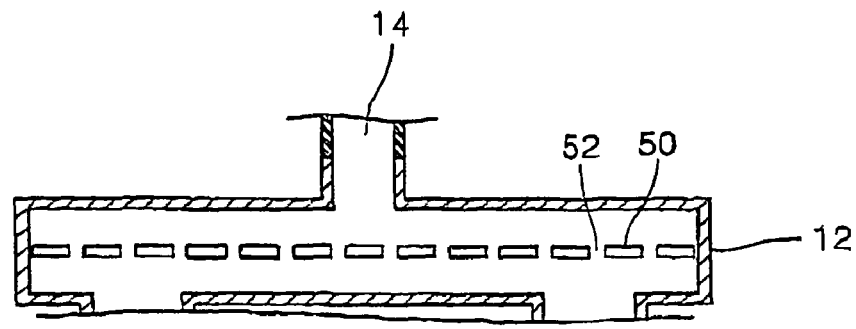
FIG. 8 is a sectional view showing an example in which a discharge tube head is provided with a gas shower plate.
Figure 9:
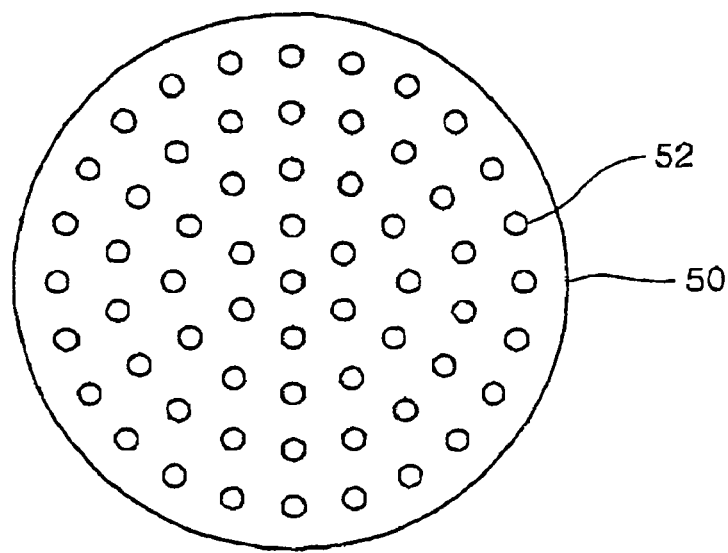
FIG. 9 is a top view of the gas shower plate in FIG. 8.
Figure 10:
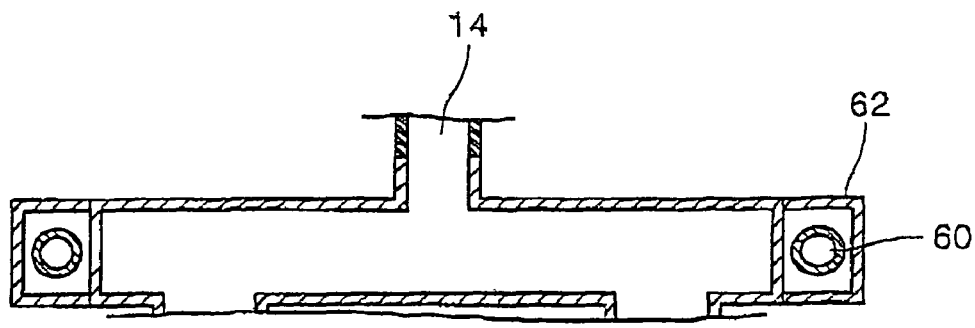
FIG. 10 is a view an example in which a cooling tube is mounted in a discharge tube head.

FIG. 8 is a sectional view showing an example in which a discharge tube head is provided with an gas shower plate and FIG. 9 is a top view of the gas shower plate in FIG. 8. Referring to the figures, it may dispose a gas shower plate 50 in which a plurality of through holes 52 are formed transversely in the discharge tube head 12 to allow for having uniform distribution on inflow of the gas. Furthermore, in order to prevent the discharge tube head 12 from being overheated as shown in FIG. 10, it may dispose a cooling tube 60 around the discharge tube head 12, and mount a bracket 62 for it.

Figure 11:
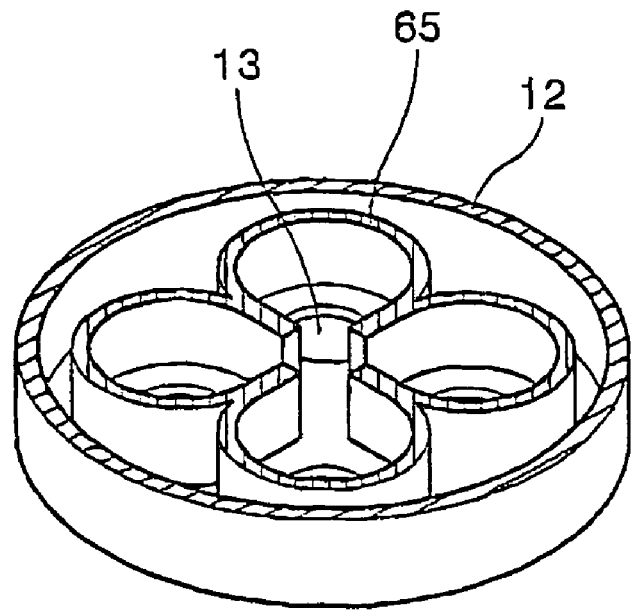
FIGS. 11 and 12 are a perspective view and a top view of an example in which discharge tube head is provided with gas guides, respectively.
Figure 12:
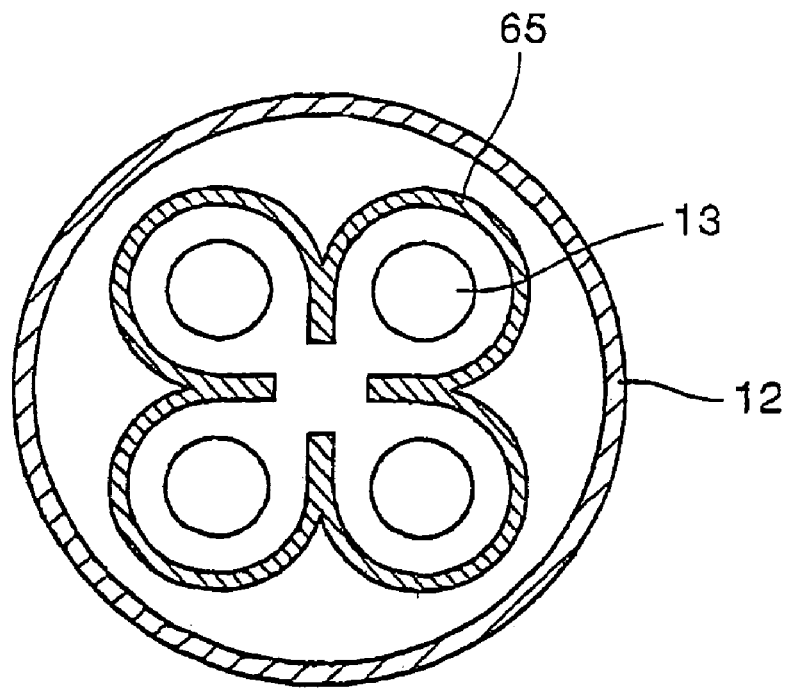
Figure 13:
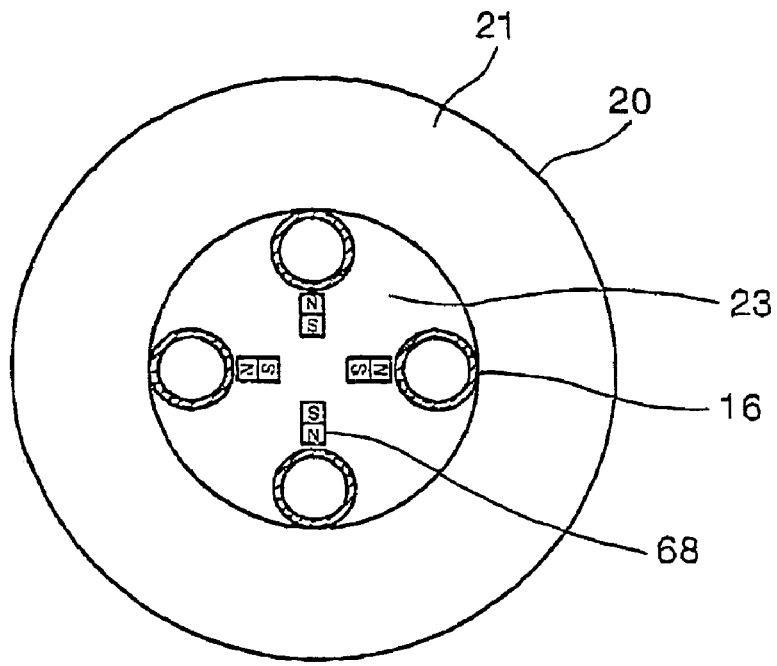
FIGS. 13 and 14 are views showing an example in which process chamber is provided with permanent magnets.
Figure 14:
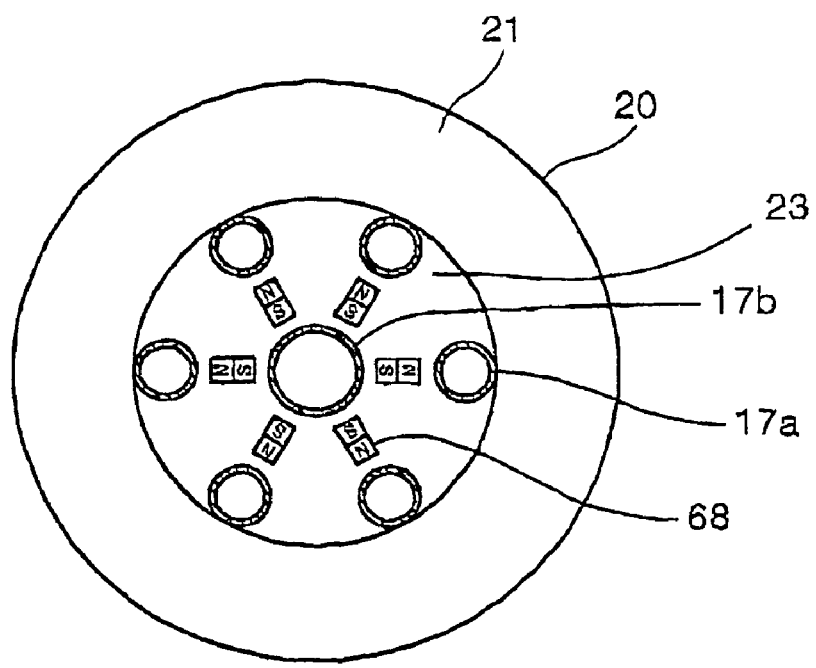

On the other hand, as shown in FIGS. 11 and 12, it may dispose gas guides 65 around the opening 13 arranged in a symmetric structure in the discharge tube head 12 in order that plasma discharge loops are formed among the openings which are symmetric to each other. Together with this or separately from this, as shown in FIGS. 13 and 14, it may dispose a plurality of permanent magnets 68 for inducing discharge paths in the upper surface 23 of the process chamber 20 so as to be made uniformly the plasma discharge inside the process chamber 20.

Figure 15:
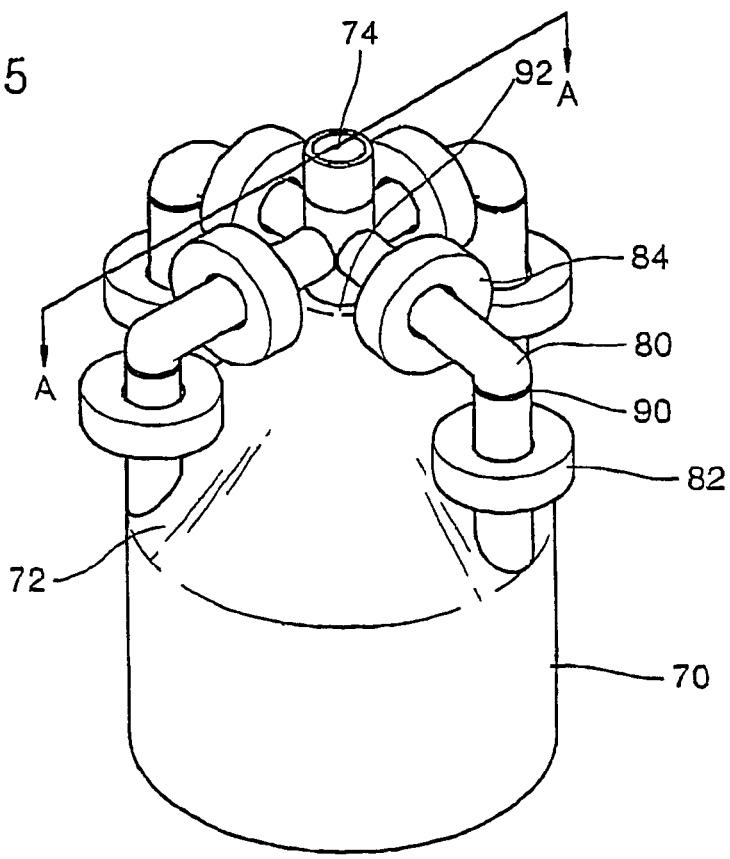
FIG. 15 is a perspective view of an inductive plasma chamber according to another embodiment of the present invention.
Figure 16:
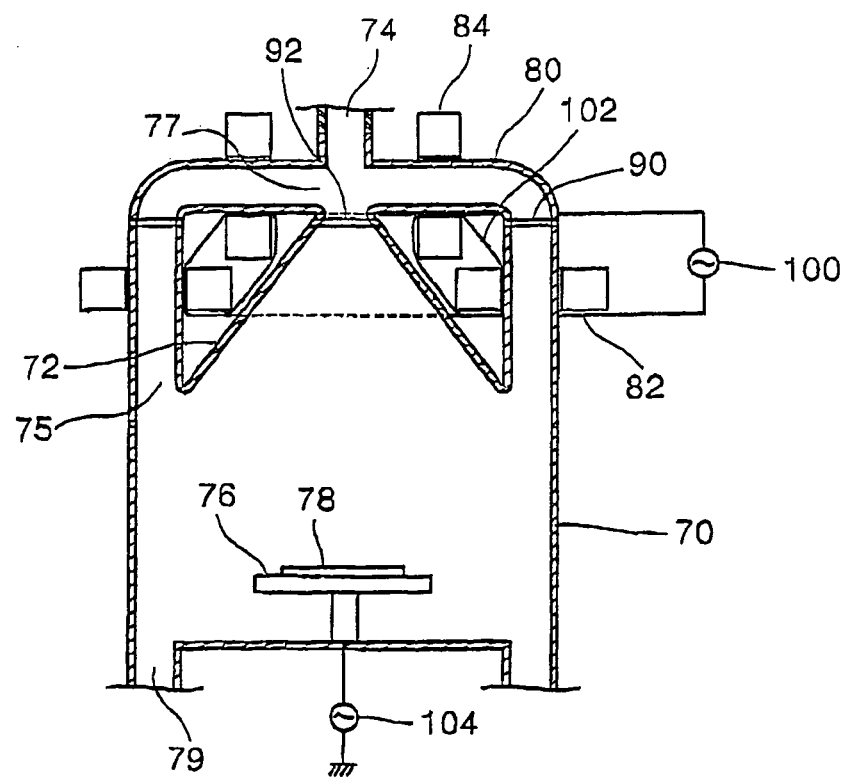
FIG. 16 is a sectional view taken along a line A-A of the inductive plasma chamber in FIG. 14.

The inductive plasma chamber of the present invention may be modified and embodied only by a plurality of discharge tube bridges as follows without disposing the discharge tube head as described above. FIG. 15 is a perspective view of an inductive plasma chamber according to another embodiment of the present invention and FIG. 16 is a sectional view taken along a line A-A of the inductive plasma chamber in FIG. 14.

Referring to the figures, the inductive plasma chamber is provided with gas outlet 79 for exhausting a gas and a susceptor 76 on which workpiece is placed inside the plasma chamber, where the process chamber 70 has an inclined surface 2 of which central portion is raised and centrally upwardly inclined. The susceptor 76 is electrically connected to a bias power supply source 104. A gas input tube 74 is disposed in the upper center of the process chamber 70. The gas input tube 74 may be insulated with a ceramic tube.

A plurality of hollow discharge tube bridges 80 are disposed between a plurality of openings 75 formed around the process chamber 70 and a plurality of openings 77 formed around the gas input tube 74. The discharge tube bridges 80 are bended in an "L"-shape, the ferrite cores 82 and 84 are disposed at both sides of the bended portion, respectively. The ferrite cores 82 and 84 comprise a winding 102 connected to a power supply source 100.

A connecting portion 92 between the gas introducing tube 74 and the process chamber 70 is provided with a ring-shaped vacuum seal and a ring-shaped insulation member, for example ceramic ring inside it, as described above. The plurality of discharge tube bridges 80 are also provided with the insulation member 90. Disposing position of the insulation member 90 may be the connecting portion between the gas input tube 74 and process chamber 70 and the vacuum seal may disposed together.

In such an inductive plasma chamber according to the modification of present invention, an electromotive force is transmitted into the plurality of discharge tube bridges 80 and the process chamber 70 to cause plasma discharge if the process gases are injected through the gas inlet 74 and power from the power supply source 100 is supplied to the winding 102. Discharge paths are formed between the discharge tube bridges which are opposite to each other when 4 discharge tube bridges 80 are present.

Thus, multiple discharge paths are formed by the multiple discharge tube bridges 80 so that a high density plasma with a large volume is formed inside the process chamber 70. Then, the generated plasma gases uniformly diffuses toward the lower portion of the process chamber 70 above which the susceptor 76 is positioned since the upper side of the process 70 has the inclined surface 21 which is upwardly centrally inclined.

Though it is not shown in the figure, this modification also may dispose a plurality of permanent magnets for inducing plasma discharge paths in the upper inclined surface 72 of the process chamber 70 so as to be made uniformly plasma discharge inside the process chamber.

Figure 17:
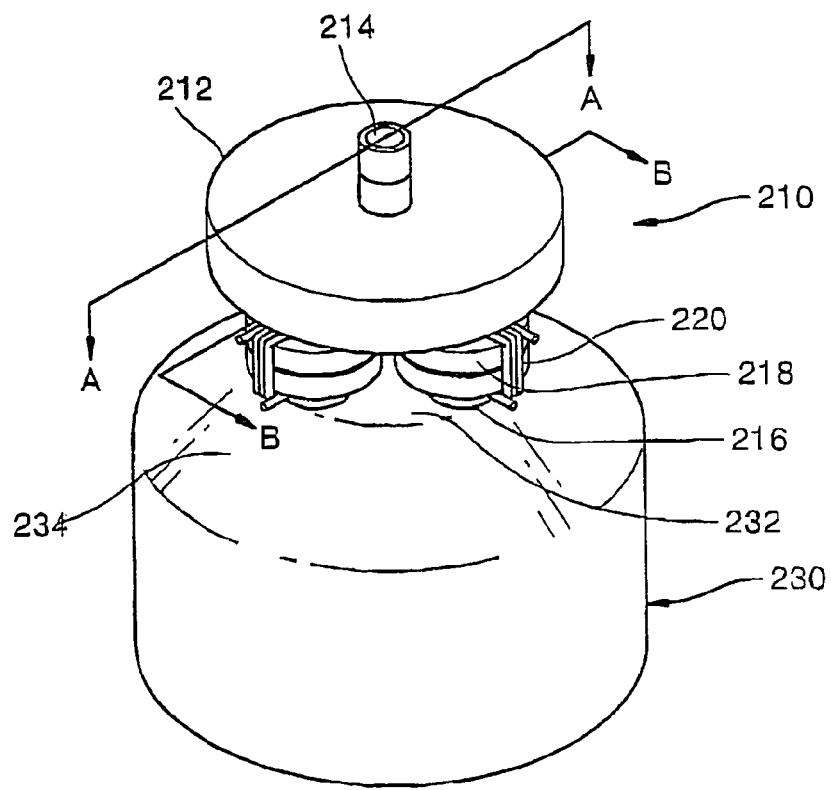
FIG. 17 is a perspective view of an inductive plasma chamber according to other embodiment of the present invention.
Figure 18:
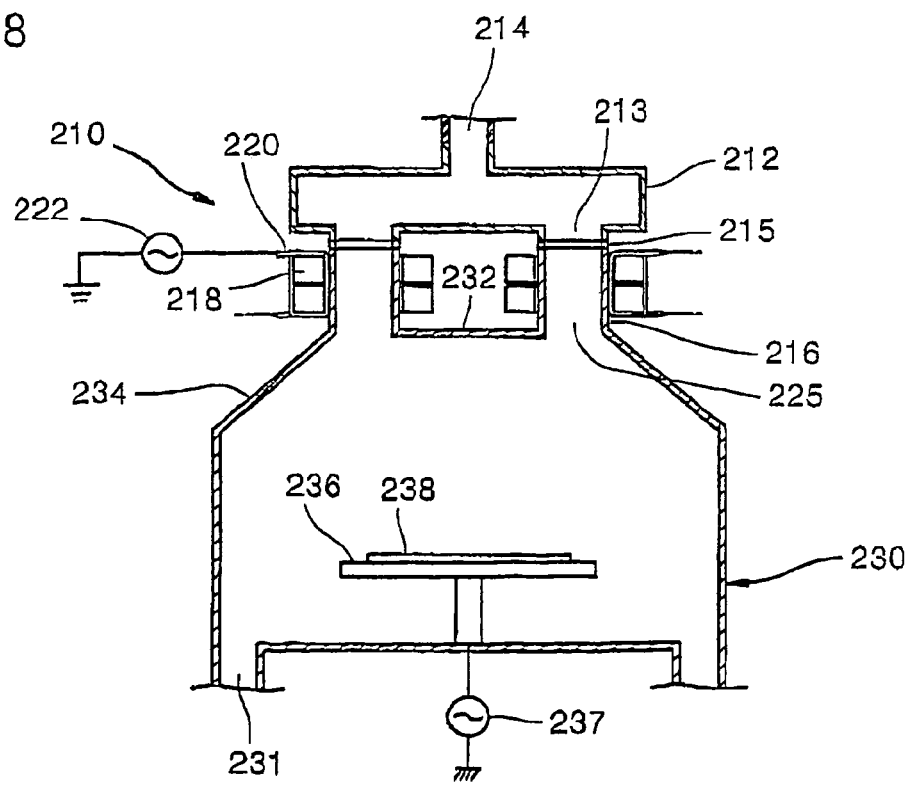
FIG. 18 is a sectional view taken along a line A-A of the inductive plasma chamber in FIG. 17.
Figure 19:
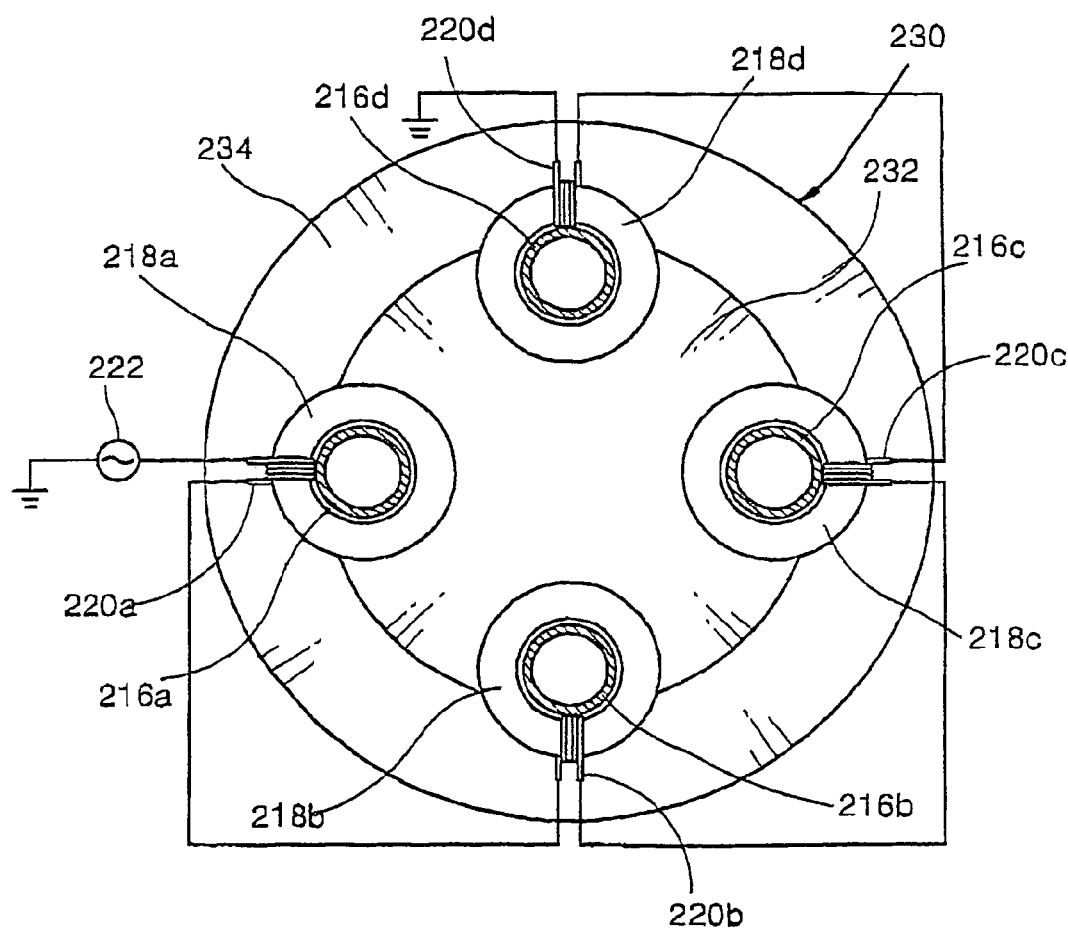
FIG. 19 is a sectional view taken along a line B-B of the inductive plasma chamber in FIG. 17 and a power supply block diagram.

FIG. 17 is a perspective view of an inductive plasma chamber according to other embodiment of the present invention, and FIGS. 18 and 19 are a sectional views taken along lines A-A and B-B of the inductive plasma chamber in FIG. 17 and a power supply block diagram.

Referring to the figures, the inductive plasma chamber is comprised of a cylindrical chamber housing 230 and a plasma reactor 210 above it. The plasma reactor 210 has a hollow discharge tube head 212 and a plurality of hollow discharge bridges 216.

The plurality of discharge tube bridges 216 generally are cylindrical and vertically arranged in a symmetric structure with a fixed interval in the upper surface 223 of the chamber housing 230. Each of the discharge tube bridge 216 is provided with a ferrite core 218 around which inductive coil 220 wound and is connected between the discharge tube head 212 and the chamber housing 230. The inductive coil 220 is electrically connected to a RF power supply 222. The discharge tube head 212 and the discharge tube bridge 216 can use aluminum coated by alumina, and an insulation member 215 is disposed in the upper end of the discharge tube bridge 216.

The discharge tube head 212 has a hollow disc-shape and is provided with a cylindrical gas inlet 214 in which gases are injected into its upper center. Process gases are provided through the gas inlet 214 from a gas supply source. The gas inlet 214 can be insulated by insulating material of separate ceramic material. A plurality of openings 213 are formed in lower portion of the discharge tube head 212. The discharge tube bridge 216 is connected between the opening 213 of the discharge tube head 212 and the opening 225 of the upper surface of the chamber housing 230.

The chamber housing 230 is provided with a gas outlet 231 connected to a vacuum pump in its bottom and a susceptor 236 on which workpiece, for example wafer is placed. The susceptor 222 is electrically connected to a bias power supply 237. A plurality of openings 225 corresponding to the opening 213 of the discharge tube head 212 are formed in its upper surface 232. The upper end flange portion of the chamber 230 has an inclined surface 234 which is inclined inwardly.

Such an inductive plasma chamber of the present invention is transmitted electromotive force inside the discharge tube head 212, the plurality of discharge tube bridges 16 and the chamber housing 230 to cause plasma discharge if the discharge gases are introduced through the gas inlet 214 and a RF power is supplied with the induction coil 218. The inductive plasma chamber of the present invention comprises a discharge path switching means so that the discharge paths are generated alternately in pairs between the plurality of discharge tube bridges 216.

Figure 20A:
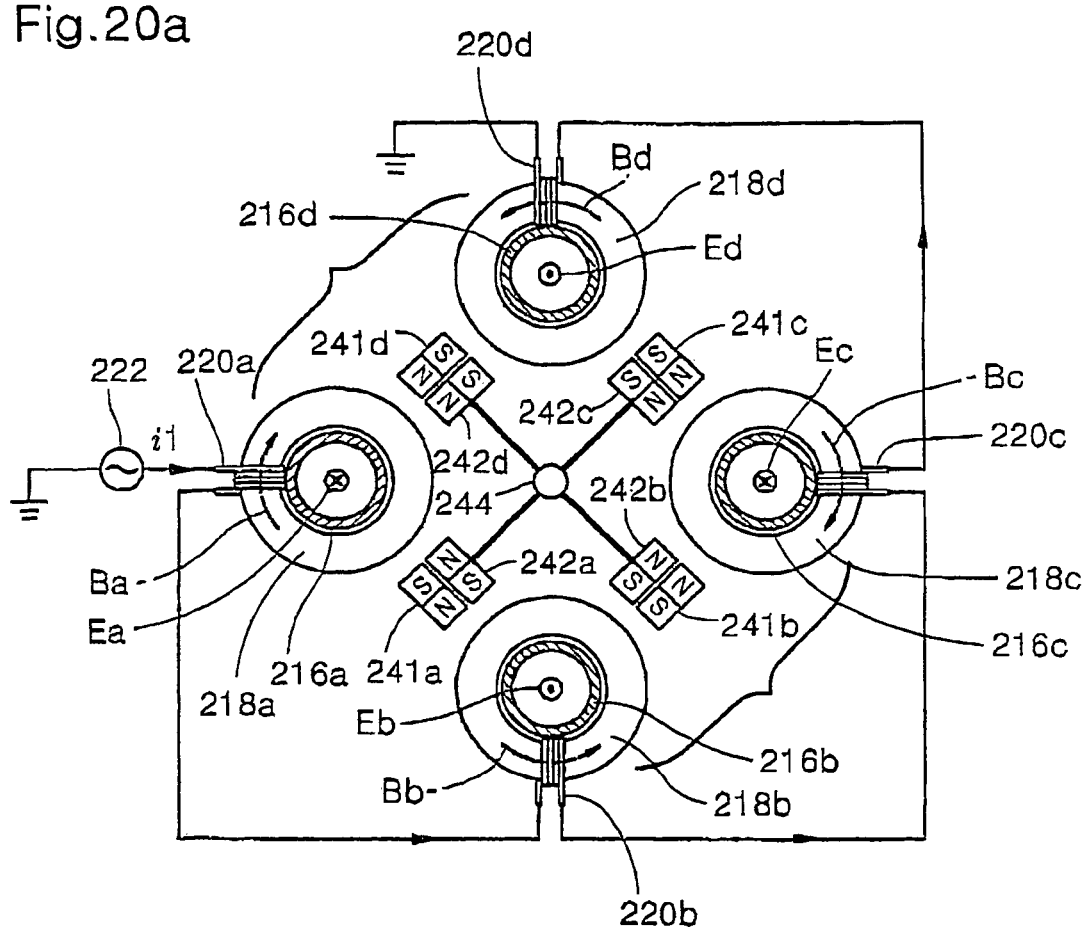
FIGS. 20a and 20b are views showing examples in which permanents are disposed between discharge tubes to induce alternately plasma discharge paths.
Figure 20B:
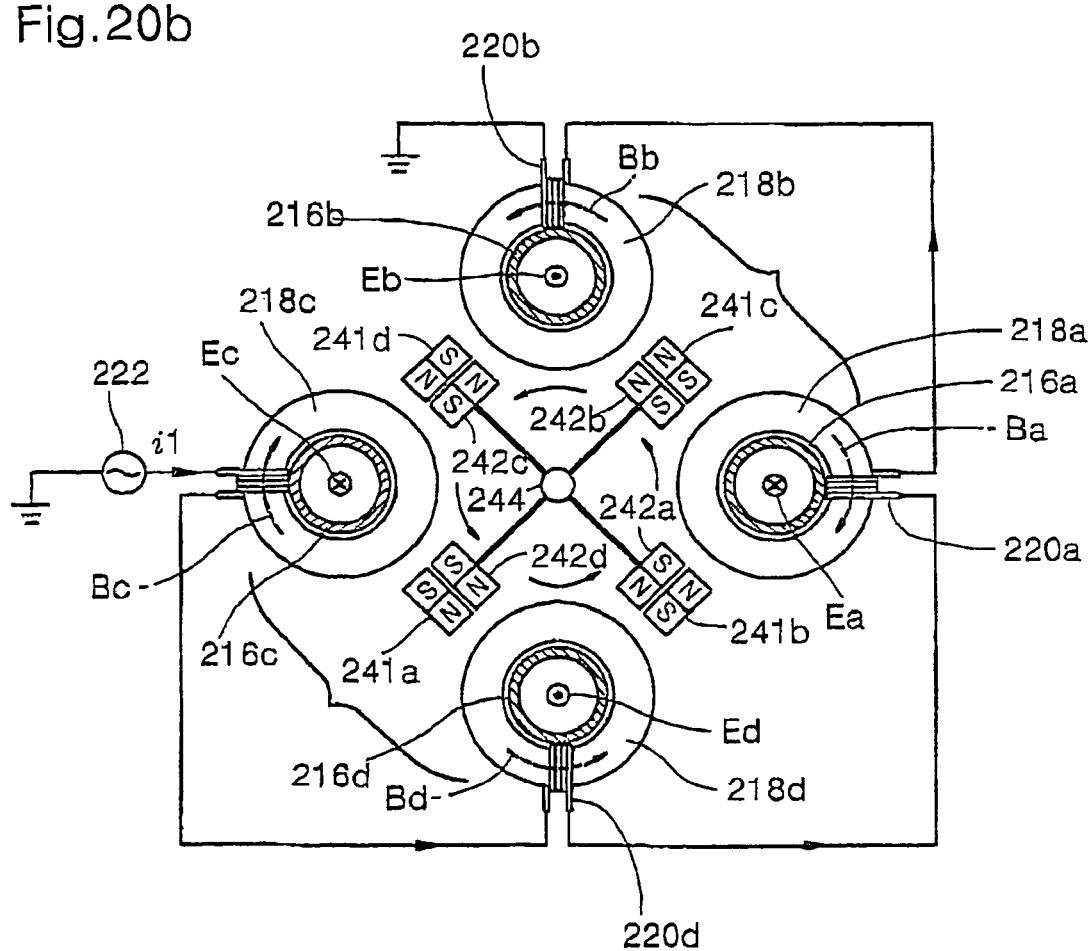

FIGS. 20a and 20b are views showing examples in which permanents are disposed between discharge tubes as a discharge path switching means for alternately inducing plasma discharge paths. Referring to the figures, each fixed permanent magnets 241a to 241d and rotatable permanent magnets 242a to 242d are arranged in pairs among a first to fourth discharge tube bridges 216a to 216d. The rotatable permanent magnets 242a to 242d are connected to a rotation axis 244 disposed on upper surface 232 of the chamber housing 230.

Here, the fixed permanent magnets 241a to 241d are arranged to have the same polarity in any one of rotational directions. For example, they are arranged such that S-pole and N-pole position clockwise. Meanwhile, the rotatable permanent magnets 242a to 242d are arranged such that polarities differ from each other in any one of rotational directions. The rotatable permanent magnets 242a to 242d rotate by 90° in right and left in a predetermined time period.

The first to fourth inductive coils 220a to 220d are wound so that magnetic fields Ba and Bc and magnetic fields Bb and Bd are induced in the identical direction to each other between facing ones of the first to fourth ferrite cores 218a to 218d disposed in the discharge tube bridges 216a to 216d. For example, each of the first and third ferrite cores 218a and 218c and the second and fourth ferrite cores 218b, 218d are wound so that the magnetic fields are induced in the same direction. Accordingly, the directions of the secondary electric fields Ea to Ed induced by the inductive magnetic fields Ba to Bd also are the same in opposite position.

If the rotatable permanent magnets 242a to 242d rotate by 90° in right and left in a predetermined time period, the pairs of the permanent magnets positioned between the first to fourth discharge tube bridges 16a to 16d have same and different polarities alternately. The intensity of the magnetic field of the pair of permanent magnet having the same polarities increases while the intensity of the magnetic field of the pair of permanent magnets arranged to have the different polarizations decreases. Accordingly, plasma discharge paths are formed between the discharge tubes in which the pair of the permanent magnets having the same polarities is arranged. Thus, the plasma discharge paths are alternately formed together with the discharge tubes, which are adjacent to each other, in the first to fourth discharge bridges 216a to 216d according to a predetermined time period.

For example, as shown in FIG. 20a, plasma paths are formed between the first and the fourth discharge tube bridges 216 and 216d and the second and third discharge tube bridge 216b and 216c in which pairs of permanent magnets are arranged in the identical direction to each other. After a predetermined time period, if the rotation axis 244 is rotated, as shown in FIG. 20b, a position of the pair of permanent magnets arranged in the identical direction to each other is changed. Thereby, plasma discharge paths are formed between the first and the second discharge tube bridges 216a and 216b and the third and the fourth discharge tube bridges 216c and 216d.

Thus, the plasma discharge paths are alternately formed between the plurality of discharge tubes, whereby the volume of the plasma is formed widely and it can obtain a uniform plasma generating density. Though the permanent magnet is used in this embodiment, it can constitute so that the same effect is obtained even by an electromagnet.

Figure 21A:
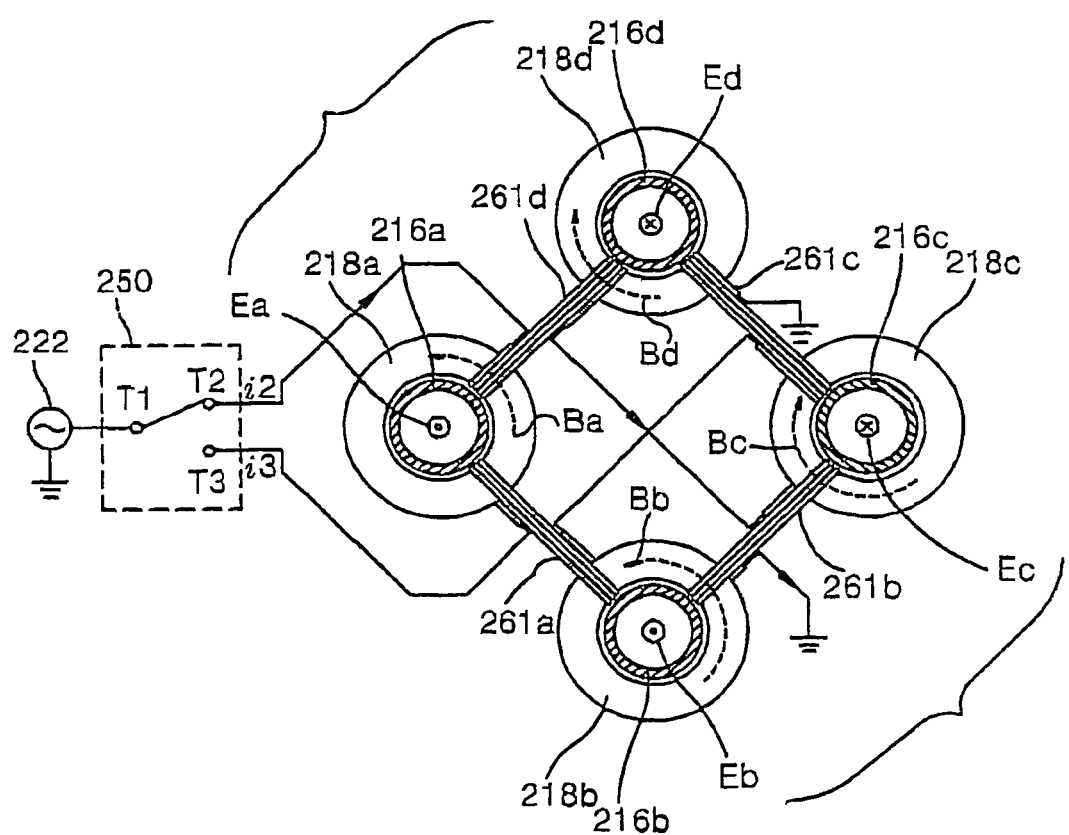
FIGS. 21a and 21b are views showing an example in which induction coils are connected to an switching circuit in parallel to induce alternately plasma discharge paths.
Figure 21B:
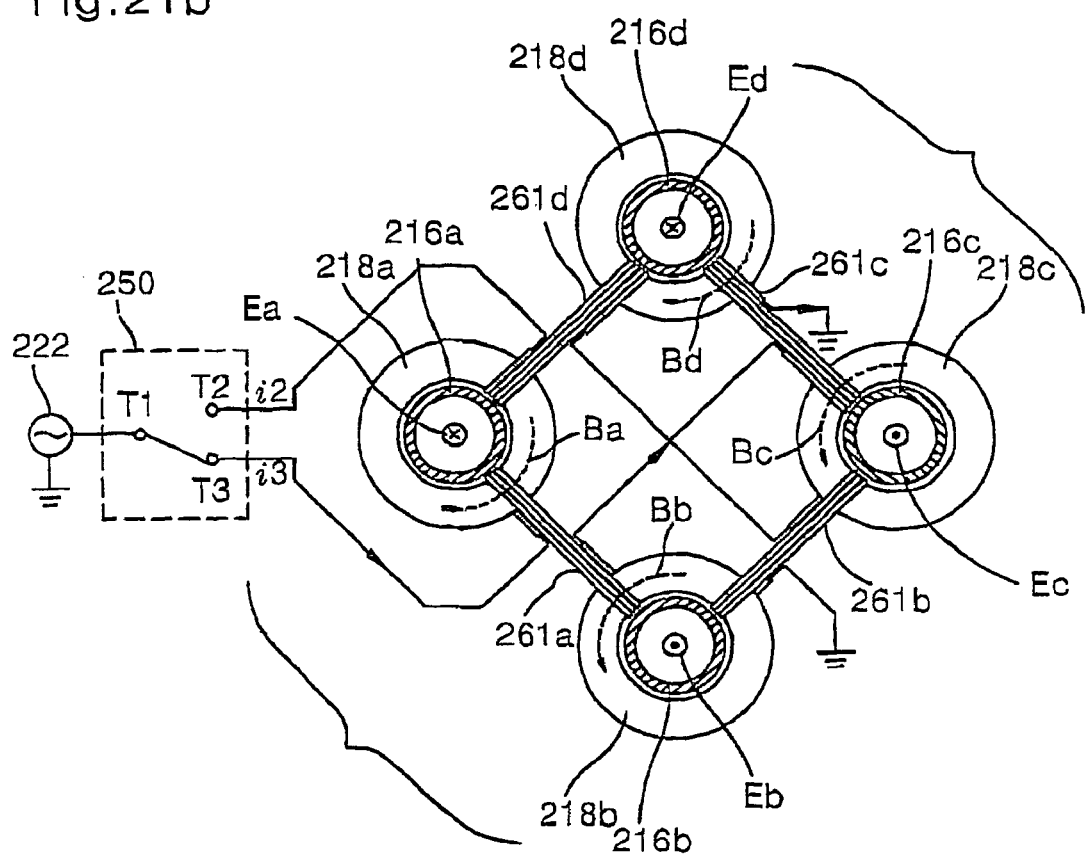

FIGS. 21a and 21b are a second embodiment and are views showing an example constituting induction coils connected to switching circuit in parallel so that plasma discharge paths are induced alternately.

Referring to the figures, the inductive plasma chamber according to the second embodiment of the present invention comprises a switching circuit 250 as a discharge path switching means for inducing alternately plasma discharge path. The switching circuit 250 alternately outputs a RF signal which is inputted via input terminal T1 in a predetermined time period via 2 outputs T2 and T3.

The first to fourth ferrite cores 218a to 218d are wound by the first to fourth inductive coils 261a to 261d to be paired with adjacent one. For example, the first and third inductive coils 261a and 261c are wound to corresponding cores so that each of the first and second ferrite cores 218a and 218b and the third and fourth ferrite cores 218a and 218b pair and they are connected in series to be connected to one output terminal T3 of the switching circuit 250. And, the second and fourth inductive coils 261b and 261d are wound to corresponding cores so that each of the second and third ferrite cores 218b and 218c and the fourth and firth ferrite cores 218d and 218a pair and they are connected in series to be connected to one output terminal T2 of the switching circuit 250.

In the inductive plasma chamber thus constituted, plasma discharge paths are formed between the discharge tube bridges 216a to 216d as follows.

First, referring to FIG. 21a, in the switching circuit 250, when the first terminal T1 and the second terminal T2 are connected a current i2 is supplied with the fourth and the second inductive coils 261d and 261 b, magnetic fields Ba to Bd are induced whereby the secondary electric fields Ea to Ed are induced. Plasma discharge paths are formed between the first and the fourth discharge bridges 216a and 216d and the second and the third discharge bridges 216b and 216c in which the secondary electric fields Ea and Ed and the electric fields Eb and Ec induced in different directions are formed.

After a predetermined time period, referring to FIG. 21 b, when the switching circuit 250 is switched such that the first terminal T1 and the third terminal T3 are connected, current i3 is supplied with the first and the third inductive coils 261a to 261c so that the magnetic fields Ba to Bd are induced, whereby the secondary electric fields Ea to Ed are induced. Plasma discharge paths are formed between the first and the second discharge tube bridges 216a and 216b and the third and the fourth discharge tube bridges 216c and 216d in which the secondary electric fields Ea and Eb and the electric fields Ec and Ed induced in different directions are formed.

Meanwhile, the switching circuit 250 should be embodied as a circuit which has not short-circuit on switching operation since it must transmit high power. A view showing a construction of the switching circuit is illustrated in FIGS. 22a and 22b.

Referring to the figures, the switching circuit 250 comprises inductive coils 252 and 254 and inductive coils 255 and 257 to which ferrite cores 251 and 253 and ferrite cores 255 and 257 are wound, wherein 2 ferrite cores 251 and 253 and 2 ferrite cores 255 and 257 which have a U-shape and in which magnetic flux inlet and outlet are opposite to each other are constituted in 2 pairs. In each of 2 pairs of ferrite cores 251 and 253 and ferrite cores 255 and 257, any one of the pairs is fixed and other of the pairs are coupled to a motor 259 to be rotated by 180° forwardly and reversely in a predetermined time period. The rotatable ferrite cores 253 and 257 are linked to each other and are rotated. The coils 252 and 254 wounded to the pair of the first ferrite cores are connected in series between the first terminal T1 and the second terminal T2 and the coils 256 and 258 wound on the pair of the second ferrite cores 255 and 257 are connected in series between the first terminal T1 and the third terminal T3.

Figure 22A:
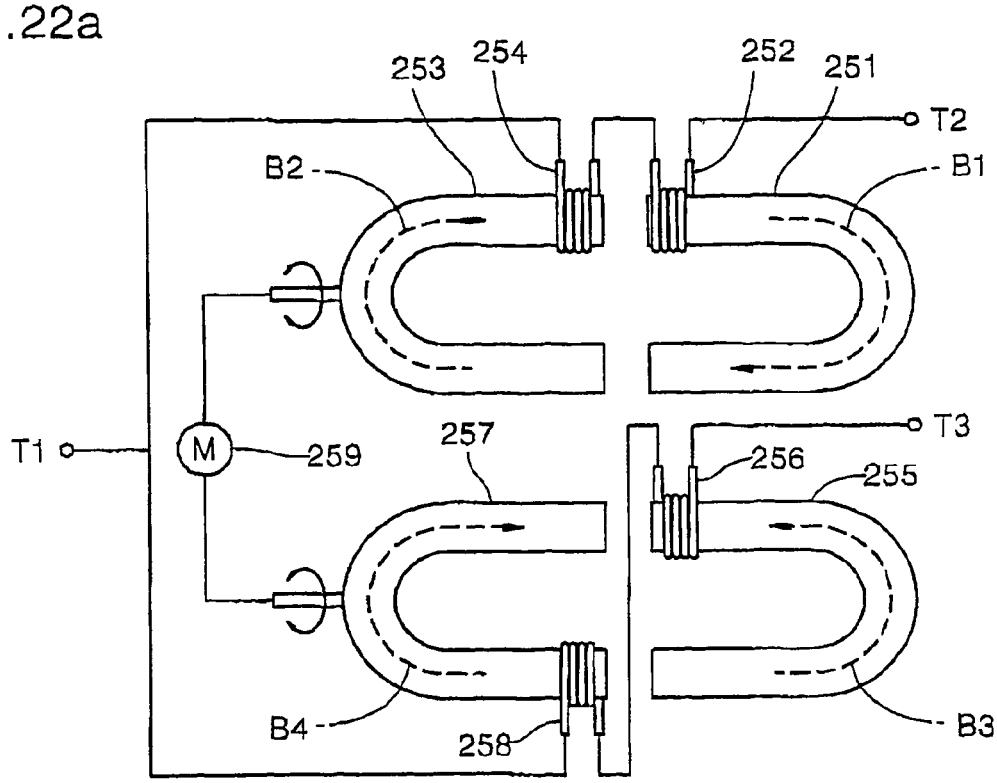
FIGS. 22a and 22b are views showing the constitution and operation of a switching circuit.

As shown in FIG. 22a, in a initial state, the pair of the first ferrite cores 251 and 253 is that the magnetic fields B1 and B2 are induced in the identical direction to each other and the pair of the second ferrite core 255 and 257 is that the magnetic field B3 and B4 are induced in reverse direction to each other. Whereby current i2 flows between the first terminal T1 and the second terminal T2 and the flow of current i3 between the first terminal T1 and the third terminal T3 is blocked.

Figure 22B:
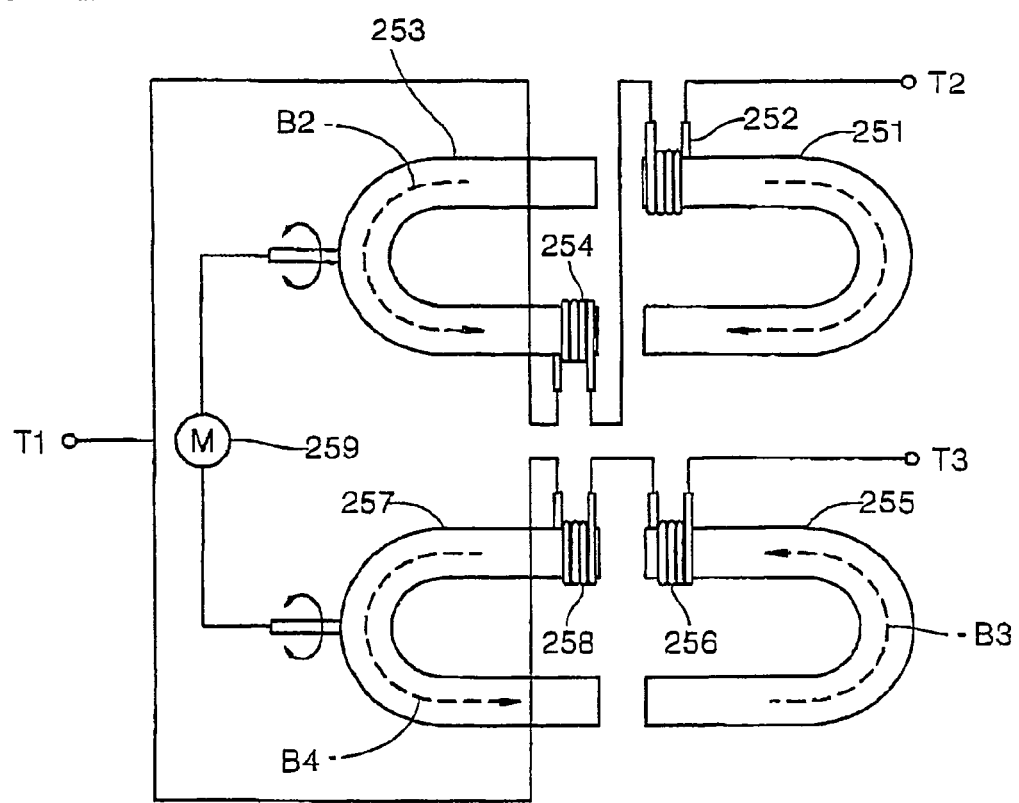

After a predetermined time period, as shown in FIG. 22b, when the rotatable ferrite core 253 and 257 are rotated by 180°, the pair of the first ferrite core 251 and 253 is that magnetic fields B1 and B2 are induced in reverse direction to each other, and the pair of the ferrite cores 255 and 257 is that magnetic field B3 and B4 are induced in the identical direction to each other. Whereby the current i2 between the first terminal T1 and the third terminal T3 is blocked and the current i3 become flowed between the first terminal T1 and the third terminal T3.

Thus, the plasma path become alternately formed between the plurality of discharge tube bridges 216a to 216d while the switching circuit 250 switches in a predetermined time period. Thereby the inductive plasma chamber of the present invention can obtain a uniform plasma generating density while plasma volume is formed widely.

Though the constitution and the operation of the induced plasma chamber comprising multiple discharge tube bridges according to the present invention have been illustrated with reference to the aforementioned description and drawings, this is only illustrated as an example and various change and modification are possible of course within range without departing from the technical spirit of the present invention According to the above description, there are effects that can enlarge volume of plasma, enhance uniformity, obtain a high-density plasma and simplify the gas supply structure. In addition, the inductive plasma chamber can obtain uniform plasma generating density by forming alternately plasma discharge path between a plurality of discharge tubes while generating a large volume of plasma by comprising a plurality of plasma discharge tube bridges.

What is claims is:

1. An inductive plasma chamber with multiple discharge tube bridges, comprising:
    a hollow discharge tube head having an upper surface and a lower surface, a gas inlet defined by an opening in the upper surface through which a gas is injected and a plurality of openings in the lower surface;
    a process chamber having a gas outlet for exhausting the gas and a susceptor on which a workpiece is placed inside the process chamber, wherein a plurality of openings corresponding to the openings of the discharge tube head are formed in a upper surface of the chamber, the process chamber formed by a external wall, the external wall having an inner surface and an outer surface, the external wall forming an upwardly centrally inclined surface in an upper portion of the inner and outer surfaces thereof, the inner surface of the external wall in the inclined portion forming an inner diameter of the process chamber;
    a plurality of tubular members having an outer surface and an inner surface, each tubular member defining a hollow discharge tube bridge connecting an opening of the discharge tube head and an opening of the process chamber, a portion of the surfaces of each of the tubular members connecting to the upwardly centrally inclined surface of the process chamber;
    at least one ferrite core disposed around at least a portion of each of the tubular members of the discharge tube bridges, the ferrite core comprising a winding connected to a power supply source for generating an electromotive force for plasma generation in the discharge tube head, the discharge bridge and the process chamber; and
    a plurality of ring-shaped insulation members and ring-shaped vacuum seals each disposed between the hollow discharge tube head and each of the discharge tube bridges to allow plasma gases to uniformly diffuse toward a lower portion of the process chamber and to uniformly maintain the plasma at a high density while increasing the volume of the plasma.

2. The inductive plasma chamber according to claim 1, wherein said discharge tube bridge has an extended structure in which a diameter of an upper end portion connected to the opening of the discharge tube head is expanded gradually, and the upper surface of the process chamber has a centrally inclined structure.

3. The inductive plasma chamber according to claim 1, wherein said discharge tube head includes a gas shower plate which is disposed transversely inside and in which a plurality of through holes are formed.

4. The inductive plasma chamber according to claim 1, wherein said discharge tube head includes a cooling channel.

5. The inductive plasma chamber according to claim 1, wherein said discharge tube bridge is cylindrical, and the plurality of discharge tube bridges are arranged in a generally uniform symmetric structure.

6. The inductive plasma chamber according to claim 5, wherein said plurality of discharge tube bridges comprises multiple discharge tube bridges having one discharge tube bridge at their center and remaining discharge tube bridges arranged around it in the same interval.

7. The inductive plasma chamber according to claim 6, wherein a transverse sectional area of the central discharge tube bridge is about a half of the sum of the transverse sectional areas of the remaining discharge tube bridges.

8. The inductive plasma chamber according to claim 5, wherein the discharge tube head comprises a gas guide therein so that plasma discharge loops are formed between the openings which are symmetric to each other at the vicinity of the opening arranged in a symmetric structure.

9. The inductive plasma chamber according to claim 1, further comprising a plurality of permanent magnets disposed for inducing plasma discharge paths in the upper surface of said process chamber so that the plasma discharge is uniformly made inside the process chamber.

10. The inductive plasma chamber of claim 1, wherein the plurality of tubular members extend from the process chamber.

11. The inductive plasma chamber of claim 1, wherein the plurality of tubular members extend from the hollow discharge tube head.

12. The inductive plasma chamber of claim 1, wherein the plurality of tubular members extend from the process chamber and from the hollow discharge tube head.

* * * * *